(12) United States Patent
Tsai et al.

(10) Patent No.: US 11,756,959 B2
(45) Date of Patent: *Sep. 12, 2023

(54) STRUCTURE AND METHOD OF INTEGRATED CIRCUIT HAVING DECOUPLE CAPACITANCE

(71) Applicant: Taiwan Semiconductor Manufacturing Co., Ltd., Hsin-Chu (TW)

(72) Inventors: Ching-Wei Tsai, Hsinchu (TW); Yu-Xuan Huang, Hsinchu (TW); Kuan-Lun Cheng, Hsin-Chu (TW); Wei Ju Lee, Hsinchu (TW); Chun-Fu Cheng, Hsinchu County (TW); Chung-Wei Wu, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 66 days.

This patent is subject to a terminal disclaimer.

(21) Appl. No.: 17/347,218

(22) Filed: Jun. 14, 2021

(65) Prior Publication Data
US 2021/0305249 A1    Sep. 30, 2021

Related U.S. Application Data

(63) Continuation of application No. 16/657,699, filed on Oct. 18, 2019, now Pat. No. 11,037,925.

(51) Int. Cl.
*H01L 27/092* (2006.01)
*H01L 21/8238* (2006.01)
(Continued)

(52) U.S. Cl.
CPC ........ *H01L 27/0921* (2013.01); *H01L 21/266* (2013.01); *H01L 21/26513* (2013.01);
(Continued)

(58) Field of Classification Search
CPC ........... H01L 27/0921; H01L 21/26513; H01L 21/266; H01L 21/74; H01L 21/823807;
(Continued)

(56) References Cited

U.S. PATENT DOCUMENTS

| 8,772,109 B2 | 7/2014 | Colinge |
| 8,785,285 B2 | 7/2014 | Tsai et al. |

(Continued)

*Primary Examiner* — Tong-Ho Kim
(74) *Attorney, Agent, or Firm* — HAYNES AND BOONE, LLP

(57) ABSTRACT

The present disclosure provides an integrated circuit that includes a circuit formed on a semiconductor substrate; and a de-cap device formed on the semiconductor substrate and integrated with the circuit. The de-cap device includes a filed-effect transistor (FET) that further includes a source and a drain connected through contact features landing on the source and drain, respectively; a gate stack overlying a channel and interposed between the source and the drain; and a doped feature disposed underlying the channel and connecting to the source and the drain, wherein the doped feature is doped with a dopant of a same type of the source and the drain.

20 Claims, 12 Drawing Sheets

(51) Int. Cl.
   *H01L 29/08*  (2006.01)
   *H01L 29/06*  (2006.01)
   *H01L 29/78*  (2006.01)
   *H01L 29/423* (2006.01)
   *H01L 29/786* (2006.01)
   *H01L 21/265* (2006.01)
   *H01L 21/266* (2006.01)
   *H01L 21/74*  (2006.01)
   *H01L 29/66*  (2006.01)
   *H01L 29/10*  (2006.01)

(52) U.S. Cl.
   CPC ...... *H01L 21/74* (2013.01); *H01L 21/823807* (2013.01); *H01L 21/823814* (2013.01); *H01L 21/823821* (2013.01); *H01L 21/823878* (2013.01); *H01L 21/823892* (2013.01); *H01L 29/0653* (2013.01); *H01L 29/0673* (2013.01); *H01L 29/0847* (2013.01); *H01L 29/1083* (2013.01); *H01L 29/42392* (2013.01); *H01L 29/66537* (2013.01); *H01L 29/66742* (2013.01); *H01L 29/66795* (2013.01); *H01L 29/7851* (2013.01); *H01L 29/78612* (2013.01); *H01L 29/78618* (2013.01); *H01L 29/78696* (2013.01)

(58) Field of Classification Search
   CPC ..... H01L 21/823814; H01L 21/823821; H01L 21/823878; H01L 21/823892; H01L 29/0653; H01L 29/0673; H01L 29/0847; H01L 29/1083; H01L 29/42392; H01L 29/66537; H01L 29/66742; H01L 29/66795; H01L 29/7851; H01L 29/78612; H01L 29/78618; H01L 29/78696; H01L 29/66439; H01L 29/785; H01L 27/092; H01L 29/775; H01L 29/105; H01L 29/7838; H01L 29/78; H01L 29/66545; B82Y 10/00
   USPC .......................................................... 257/349
   See application file for complete search history.

(56) References Cited

U.S. PATENT DOCUMENTS

| | | | |
|---|---|---|---|
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 11,037,925 | B2 * | 6/2021 | Tsai .................... H01L 29/7838 |
| 2011/0175152 | A1 | 7/2011 | Booth, Jr. et al. |
| 2013/0270620 | A1 | 10/2013 | Hu et al. |

* cited by examiner

STRUCTURE AND METHOD OF INTEGRATED CIRCUIT HAVING DECOUPLE CAPACITANCE

This application is a Continuation of U.S. patent application Ser. No. 16/657,699, filed Oct. 18, 2019, which is hereby incorporated by reference in its entirety.

BACKGROUND

Along with the evolution of integrated circuits (IC) technology, it is expected that the parasitic capacitance is reduced as less as possible for lower power and high speed. A decouple capacitance (de-cap) device is incorporated into the integrated circuits, such as logic circuits and analog circuits, to reduce the parasitic capacitance. However, the de-cap device occupies a large circuit area, which negatively impacts de-cap device density and increases production cost. Especially, when a de-cap device is used in an analog circuit that is integrated with the logic circuit and shares a same fabrication process, it occupies a large area, and/or its capacitance cannot be increased cost-effectively. It is therefore desired to have a structure of an integrated circuit having a de-cap device and a method making the same to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 2:
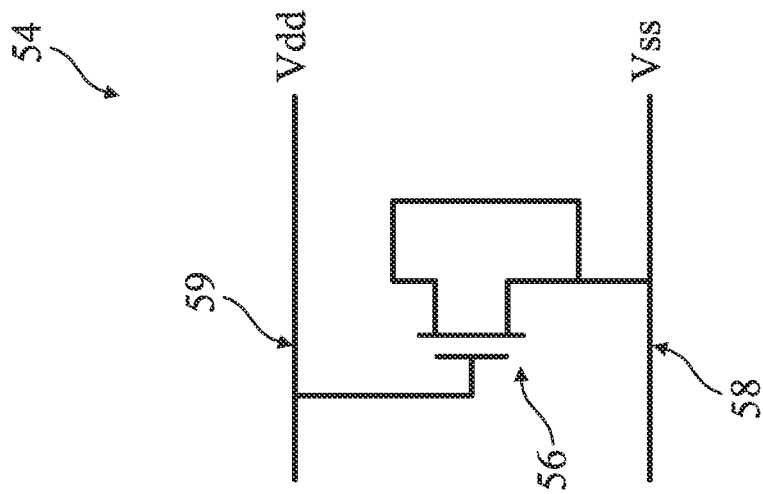
FIG. 2 is a schematic view of a de-cap device of FIG. 1, constructed according to various aspects of the present disclosure in one embodiment.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure provides various embodiments of an integrated circuit (IC) structure having a decouple capacitance (de-cap) device formed on a semiconductor substrate and a method making the same.

Figure 1:
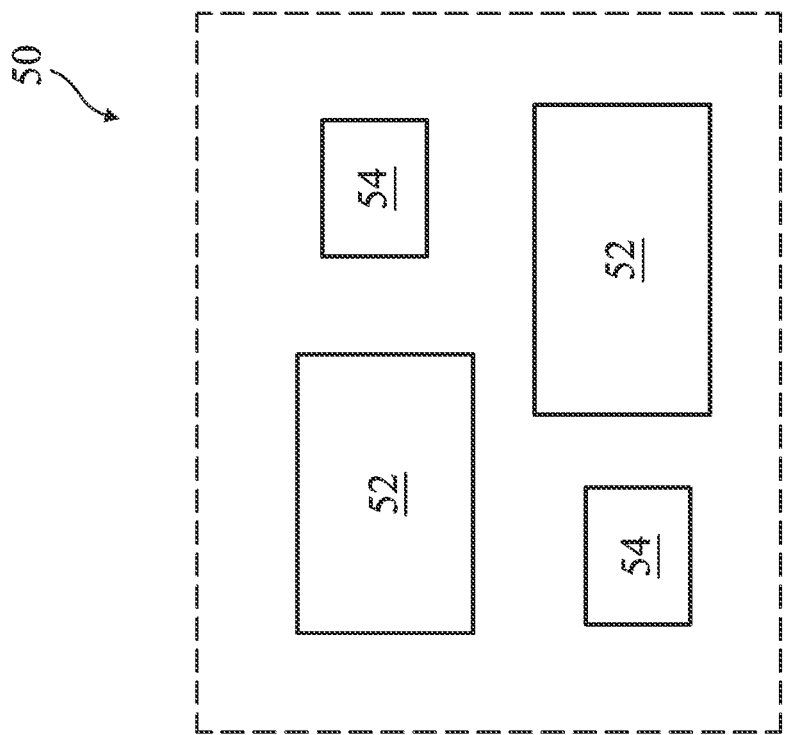
FIG. 1 is a block view of an integrated circuit (IC) structure having a de-cap device constructed according to various aspects of the present disclosure in one embodiment.

FIG. 1 is a block view of an IC structure 50, and FIG. 2 is a schematic view of a de-cap device of FIG. 1 in accordance with some embodiments. The IC structure 50 is formed on a semiconductor substrate. The IC structure 50 includes various circuit modules 52 integrated on the same semiconductor substrate. For examples, the IC structure 50 includes one or more logic circuit module, one or more analog circuit module, and other circuit modules, such as memory cells, imaging sensors, and etc. The IC structure 50 also includes one or more de-cap device 54 integrated with various circuit modules on the semiconductor substrate. In the present embodiment, the de-cap device 54 includes a transistor 56 with a source and a drain connected to a power line 58, such as a ground line (Vss) and a gate connected to a complementary power line 59, such as a high-power line (Vdd). Such configured device 54 functions as a capacitor for decoupling capacitance. The de-cap device 54, when integrated with other circuit modules, can provide various functions to enhance circuit performance, such as stabilization of the circuit. For example, the de-cap device 54 stabilizes the performance of transistors due to a lot of charges being stored in the de-cap device 54. Once the transistors are operated in high speed, the de-cap device 54 can supply charges faster than outside power, which catches up the time delay from the IR drop if the de-cap device is not presented.

Figure 3:
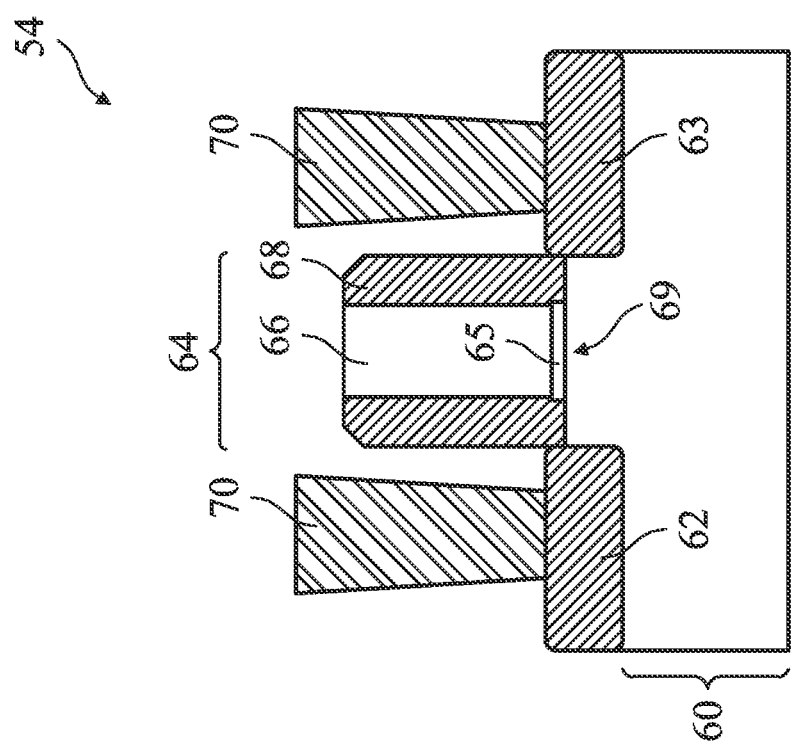
FIG. 3 is a sectional view of a de-cap device constructed according to various aspects of the present disclosure in one embodiment.

FIG. 3 is a sectional view of a de-cap device 54 in accordance with some embodiments. The de-cap device 54 is formed on a semiconductor substrate 60. The de-cap device 54 includes a field-effect transistor (FET) having a source 62 and a drain 63 interposed by a gate stack 64. The FET may be a n-type FET or alternatively p-type FET. A gate spacer 68 is further disposed on sidewalls of the gate stack 64. The gate stack 64 further includes a gate dielectric layer 65 disposed on the semiconductor substrate 60 and a gate electrode 66 disposed on the gate dielectric layer 65. The de-cap device 54 further includes a channel 69 underlying the gate electrode 66. The channel 69 is formed on active region of the semiconductor substrate 60. The de-cap device 54 may further include various contact features 70 landing on the source 62 and the drain 63, respectively. The source 62 and the drain 63 are electrically connected, such as through various conductive features (including contact features 70) of an interconnection structure.

Figure 4:
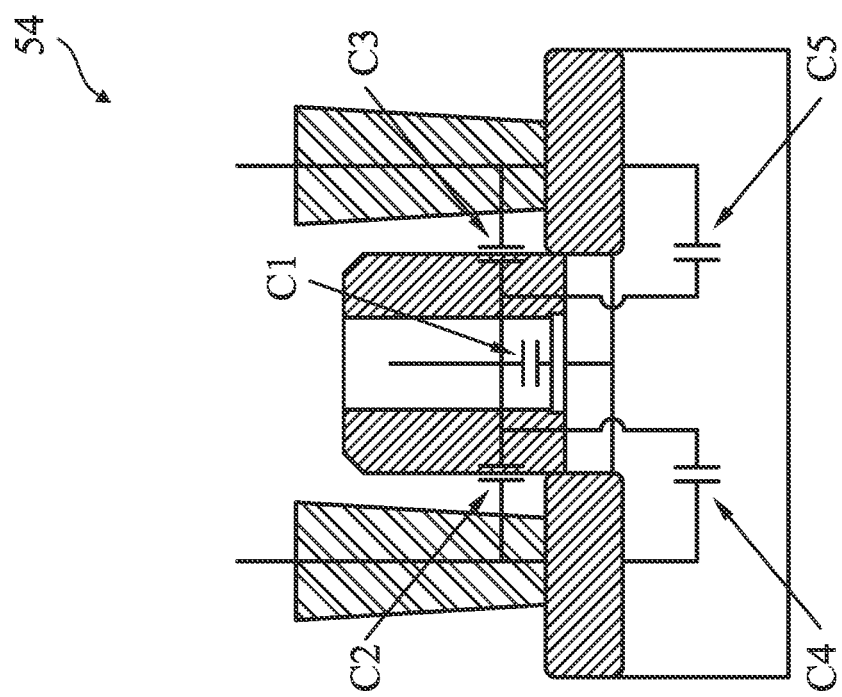
FIG. 4 is a sectional view of the de-cap device of FIG. 3 and a schematic view of the corresponding parasitic capacitance constructed according to various aspects of the present disclosure in one embodiment.

FIG. 4 is a sectional view of the de-cap device 54 with schematic view of parasitic capacitance of the de-cap device 54 constructed in accordance with some embodiments. The de-cap device 54 includes a first parasitic capacitance $C_1$ between the channel 69 and the gate electrode 66 with the gate dielectric layer 65 configured therebetween. The de-cap device 54 further includes a second parasitic capacitance $C_2$ between the contact feature 70 of the source 62 and the gate electrode 66; and a third parasitic capacitance $C_3$ between the contact feature 70 of the drain 63 and the gate electrode 66. In some embodiments where the gate stack is extended into deep into the semiconductor substrate 60, such as gate-all-around FET device, which will be further described in detail later, the de-cap device 54 further includes a fourth parasitic capacitance $C_4$ between the source 62 and the gate electrode 66; and a fifth parasitic capacitance $C_5$ between the drain 63 and the gate electrode 66.

Figure 5:
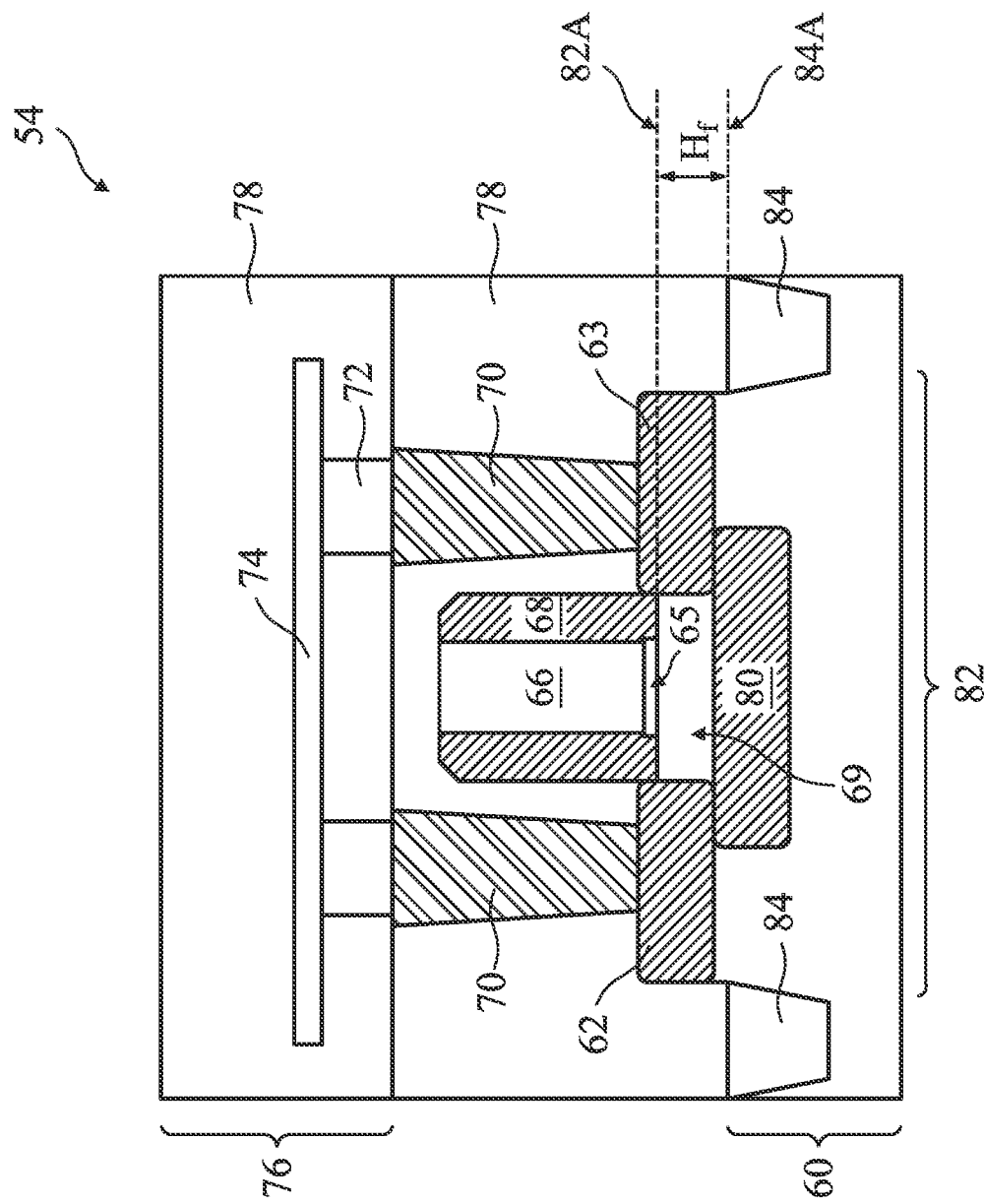
FIG. 5 is a sectional view of a de-cap device constructed according to various aspects of the present disclosure in one embodiment.

FIG. 5 is a sectional view of a de-cap device 54 constructed in accordance with some embodiments. The de-cap device 54 is formed on a semiconductor substrate 60. The de-cap device 54 includes a field-effect transistor (FET) having a source 62 and a drain 63 interposed by a gate stack 64. A gate spacer 68 is disposed on sidewalls of the gate stack 66. The gate stack 64 further includes a gate dielectric layer 65 disposed on the semiconductor substrate 60 and a gate electrode 66 disposed on the gate dielectric layer 65. The de-cap device 54 further includes a channel 69 underlying the gate electrode 66. The channel 69 is formed on active region of the semiconductor substrate 60. The de-cap device 54 may further include various contact features 70 landing on the source 62 and the drain 63, respectively. The source 62 and the drain 63 are electrically connected together by various conductive features, such as contact features 70, via features 72 and a metal line 74, of an interconnection structure 76. The gate stack 64 and the interconnection structure 76 are formed in one or more interlayer dielectric (ILD) layer 78.

Particularly, the de-cap device 54 includes a doped feature 80 disposed in the semiconductor substrate 60. The doped feature 80 is disposed under the channel 69. In the present embodiment, the doped feature 80 contacts the bottom surfaces of the source 62 and the drain 63 and therefore is connected to the source 62 and the drain 63. The doped feature 80 is different from an anti-punch-through (APT) doped feature. The APT doped feature is doped with a type opposite to that of the source 62 and the drain 63. However, the doped feature 80 is doped with a same type of the source 62 and the drain 63. For example, when the FET of the de-cap device 54 is an n-type FET, the source 62 and the drain 63 are doped with a n-type dopant while the doped feature 80 is doped with an n-type dopant as well. Therefore, the doped feature 80 is also referred to as a reverse APT doped feature 80. The reversed APT feature 80 renders the bottom surface of the channel to the gate stack 64 planar, thereby increasing the capacitance of the de-cap device 54. The reversed APT feature 80 raises up the inversion voltage and renders it hard to inverse (or deplete), therefore eliminating or reducing the leakage path at sub-channel. If it is depleted, there would be no capacitance thereby. The reversed APT feature makes the bottom channel from depletion state to normally no-depletion state to gain the capacitance. In some embodiments as noted above, the de-cap device 54 functions as a capacitor and includes a capacitor between the gate electrode 66 and the channel 69 with the source 62 and the drain 63 connected together. However, the connection between the source 62 and the drain 63 is getting weak due to the voltage drop from the resistance of various components, such as the contact features 70, the source 62 and the drain 63. The reversed APT doped feature 80 further connects the source 62 and the drain 63 from the bottom in addition to the connection through the contact features 70 on the top, which may additionally gain capacitance accordingly.

Still referring to FIG. 5, the de-cap device 54 may be formed in a fin active region 82 extruded above the semiconductor substrate 60. The semiconductor substrate 60 includes various isolation features 84 to provide isolation function. The fin active regions 82 are surrounded by the isolation features 84 and are extruded above the isolation features 84. The top surface 82A of the fin active region 82 is above the top surface 84A of the isolation feature 84 with a fin height Hf. In some embodiments, the isolation features 84 include shallow-trench isolation (STI) features. The isolation feature 84 includes silicon oxide, silicon nitride, silicon oxynitride, other suitable dielectric materials, or combinations thereof. The isolation feature 84 is formed by any suitable process. As one example, forming STI features includes a lithography process to expose a portion of the substrate, etching a trench in the exposed portion of the substrate (for example, by using a dry etching and/or wet etching), filling the trench (for example, by using a chemical vapor deposition process) with one or more dielectric materials, and planarizing the substrate and removing excessive portions of the dielectric material(s) by a polishing process, such as a chemical mechanical polishing (CMP) process. In some examples, the filled trench may have a multi-layer structure, such as a thermal oxide liner layer and filling layer(s) of silicon nitride or silicon oxide.

The semiconductor substrate 60 includes silicon. Alternatively, the substrate 60 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 60 also include a silicon-on-insulator (SOI) substrate. SOI substrates are fabricated using separation by implantation of oxygen (SIMOX), wafer bonding, and/or other suitable methods.

Figure 6:
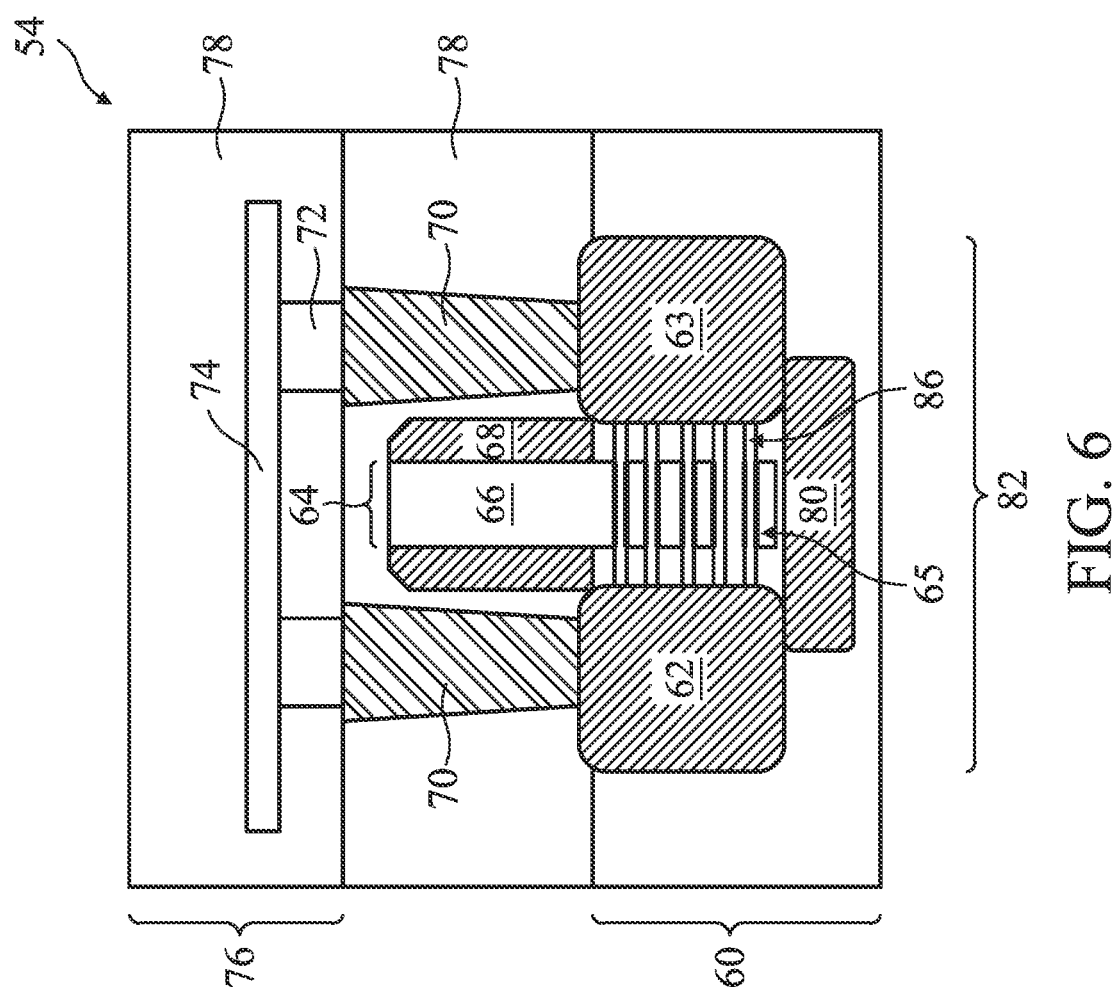
FIG. 6 is a sectional view of a de-cap device constructed according to various aspects of the present disclosure in another embodiment.

FIG. 6 is a sectional view of a de-cap device 54 constructed in accordance with some embodiments. The de-cap device 54 is formed on a semiconductor substrate 60. The de-cap device 54 includes a nanostructure, such as a nanowire, nanosheet or other suitable nanostructures. In the present embodiment, the de-cap device 54 includes a gate-all-around (GAA) FET structure having a source 62 and a drain 63 interposed by a gate stack 64. A gate spacer 68 is further disposed on sidewalls of the gate stack 64. The gate stack 64 further includes a gate dielectric layer 65 disposed on the semiconductor substrate 60 and a gate electrode 66 disposed on the gate dielectric layer 65. The de-cap device 54 further includes a plurality of channels (or channel regions) 86 vertically stacked on the semiconductor substrate 60. The source 62 and the drain 63 extend down to connect with each of the plurality of channels 86. Particularly, the gate dielectric layer 65 surrounds each of the plurality of channels 86 and the gate electrode 66 surrounds each of the plurality of channels 86 interposed by the gate dielectric layer 65. The de-cap device 54 may further include various contact features 70 landing on the source 62 and the drain 63, respectively. The source 62 and the drain 63 are electrically connected together by various conductive features, such as contact features 70, via features 72 and a metal line 74, of an interconnection structure 76. The de-cap device 54 further includes a doped feature 80 disposed below the plurality of channels 86. The doped feature 80 is disposed below the source 62 and the drain 63. In the present embodiment, the doped feature 80 is configured to contact the bottom surfaces of the source 62 and the drain 63. In various embodiments, the channels 86 may include one or more semiconductor material same or different from the semiconductor material of the semiconductor substrate 60, such as silicon, germanium, silicon germanium, silicon carbide or other suitable semiconductor materials.

The formation of the de-cap device 54 or the IC structure 50 is further described with reference to FIG. 7 as a flowchart of a method 100 constructed in accordance with some embodiments and with further reference FIGS. 1, 5 and 6. The de-cap device 54 includes a fin FET 56 as illustrated in FIGS. 1 and 5, or a GAA-FET structure as illustrated in FIG. 6, according to various embodiments. The present disclosure is not limited to any particular number of devices or device regions, or to any particular device configurations. For example, though the IC structure 50 as illustrated in FIG. 6 is a GAA-FET structure, the present disclosure may also provide embodiments for fabricating other three-dimensional FET devices, such as a fin FET (FinFET) structure. In various embodiments, the IC structure 50 may include a GAA FET structure with a plurality of FETs stacked on, such as p-type FETs (PFETs), n-type FETs (NFETs), fin-like FETs (FinFETs), metal-oxide semiconductor field effect transistors (MOSFET), complementary metal-oxide semiconductor (CMOS) transistors, bipolar transistors, high voltage transistors, high frequency transistors, and/or other memory cells. In various examples, the IC structure 50 may include logic circuits, memory circuits, such as static random-access memory (SRAM), and/or other suitable circuits having active components (such as transistors, diodes, and imaging sensors) and passive components (such as resistors, capacitors, and inductors). The IC structure 50 may be an intermediate device fabricated during processing of an integrated circuit (IC), or a portion thereof.

The method 100 includes a block 101 by receiving a workpiece having a semiconductor substrate 60. As described earlier, the semiconductor substrate 60 includes one or more semiconductor material, such as silicon. Alternatively, the semiconductor substrate 60 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 60 may also include a silicon-on-insulator (SOI) substrate. SOI substrates are fabricated using separation by implantation of oxygen (SIMOX), wafer bonding, and/or other suitable methods. In some embodiments associated with the de-cap device 54 having a GAA-FET, such as de-cap device 54 in FIG. 6, the semiconductor substrate 60 includes a stack of alternating a first semiconductor (such as silicon (Si)) films and a second semiconductor (such as silicon germanium (SiGe)) films epitaxially grown on the silicon substrate 60. During a wire-release process, one type of films, such as SiGe films, are selectively removed, another type of films, such as Si films, are patterned to form a plurality of channels 86 vertically stacked.

The method 100 may include other operations, such as an operation 102 to form various doping features, such as doped wells and channel 69 in FIG. 5 or a plurality of channels 86 in FIG. 6, by proper processes, such as ion implantations.

The Method 100 includes an operation 103 to form a reversed APT doped feature 80 underlying the channel 69 (in FIG. 5) or underlying the plurality of channels 86 (in FIG. 6). In the present embodiment, the reversed APT doped feature 80 connects to the source 62 and the drain 63. In furtherance of the embodiment, the reversed APT doped feature 80 contacts to the bottom surface of the source 62 and the drain 63. The reversed APT doped feature 80 has a same type of dopant of the source 62 and the drain 63 while an APT doped feature has a doping type opposite to that of the source 62 and the drain 63.

Figure 8:
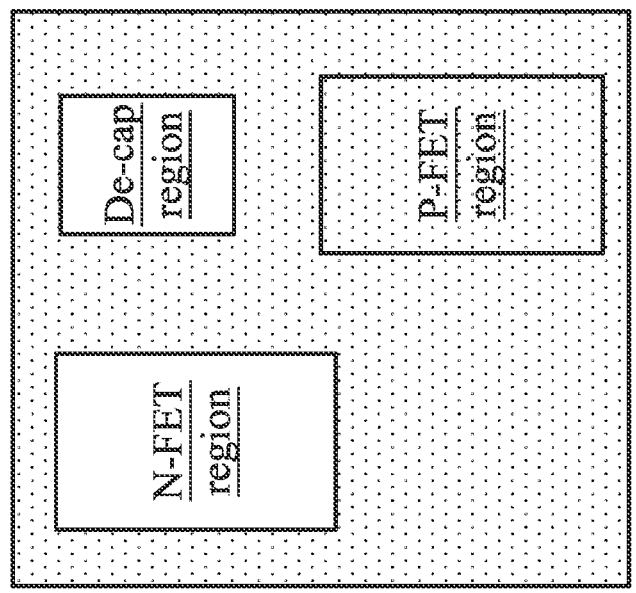

Thus, the reversed APT doped feature 80 of a p-type FET (or a p-type GAA-FET) can be simultaneously formed with a APT doped feature of a n-type FET (or a n-type GAA-FET) by a same process, such as an ion implantation process without increasing the fabrication cost, as illustrated in FIG. 8. FIG. 8 is a photomask 200 used in a lithography process to form a patterned resist layer to define regions for APT doped features and the reversed APT doped features 80. When the IC structure 50 includes a region for p-type FETs (or p-type GAA-FETs, collectively referred to as "P-FET region"); a region for n-type FETs (or n-type GAA-FETs, collectively referred to as "N-FET region"); and a region for a de-cap device 54 including a p-type FET (or a p-type GAA-FET, collectively referred to as "De-cap region"), the photomask 200 includes a pattern with openings aligned to the N-FET region and De-cap region while the P-FET region is covered. Accordingly, the resist layer coated on the workpiece is patterned by a lithography process that includes an exposure process using the photomask 200 and a developing process. The patterned resist layer may be transferred to a hard mask using as an ion implantation mask. Then an ion implantation process is performed through the openings of the patterned resist layer (or of the hard mask) to introduce p-type dopant (such as boron) into the active regions below the channels, thereby forming the reversed APT doped feature 80 to the de-cap device 54 in the De-cap region and the APT doped feature to the n-type FETs in the N-FET region with a same doping profile.

Figure 9:
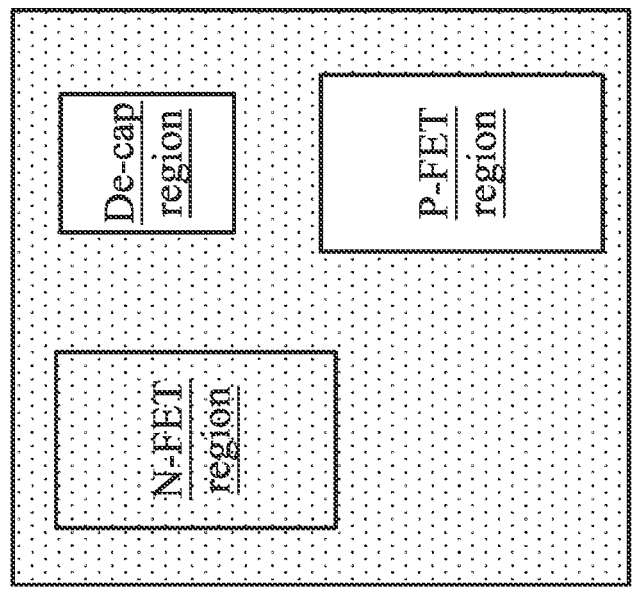
FIGS. 8 and 9 are top views of a mask structure used in the method of FIG. 7 in accordance with various embodiments.

Similarly, the reversed APT doped feature 80 of a n-type FET (or a n-type GAA-FET) can be simultaneously formed with a APT doped feature of a p-type FET (or a p-type GAA-FET) by a same process, such as an ion implantation process, as illustrated in FIG. 9. FIG. 9 is a photomask 202 used in a lithography process to form a patterned resist layer to define regions for APT doped features and the reversed APT doped features 80. When the IC structure 50 includes a region for n-type FETs (or n-type GAA-FETs, collectively referred to as "N-FET region"); a region for p-type FETs (or p-type GAA-FETs, collectively referred to as "P-FET region"); and a region for a de-cap device 54 including a n-type FET (or a n-type GAA-FET, collectively referred to as "De-cap region"), the photomask 200 includes a pattern with openings aligned to the P-FET region and De-cap region while the N-FET region is covered. Accordingly, the resist layer coated on the workpiece is patterned by a lithography process that includes an exposure process using the photomask 202 and a developing process. The patterned resist layer may be transferred to a hard mask using as an ion implantation mask. Then an ion implantation process is performed through the openings of the patterned resist layer (or of the hard mask) to introduce n-type dopant (such as phosphorous) into the active regions below the channels, thereby forming the reversed APT doped feature 80 to the de-cap device 54 in the De-cap region and the APT doped feature to the p-type FETs in the P-FET region with a same doping profile.

Figure 10:
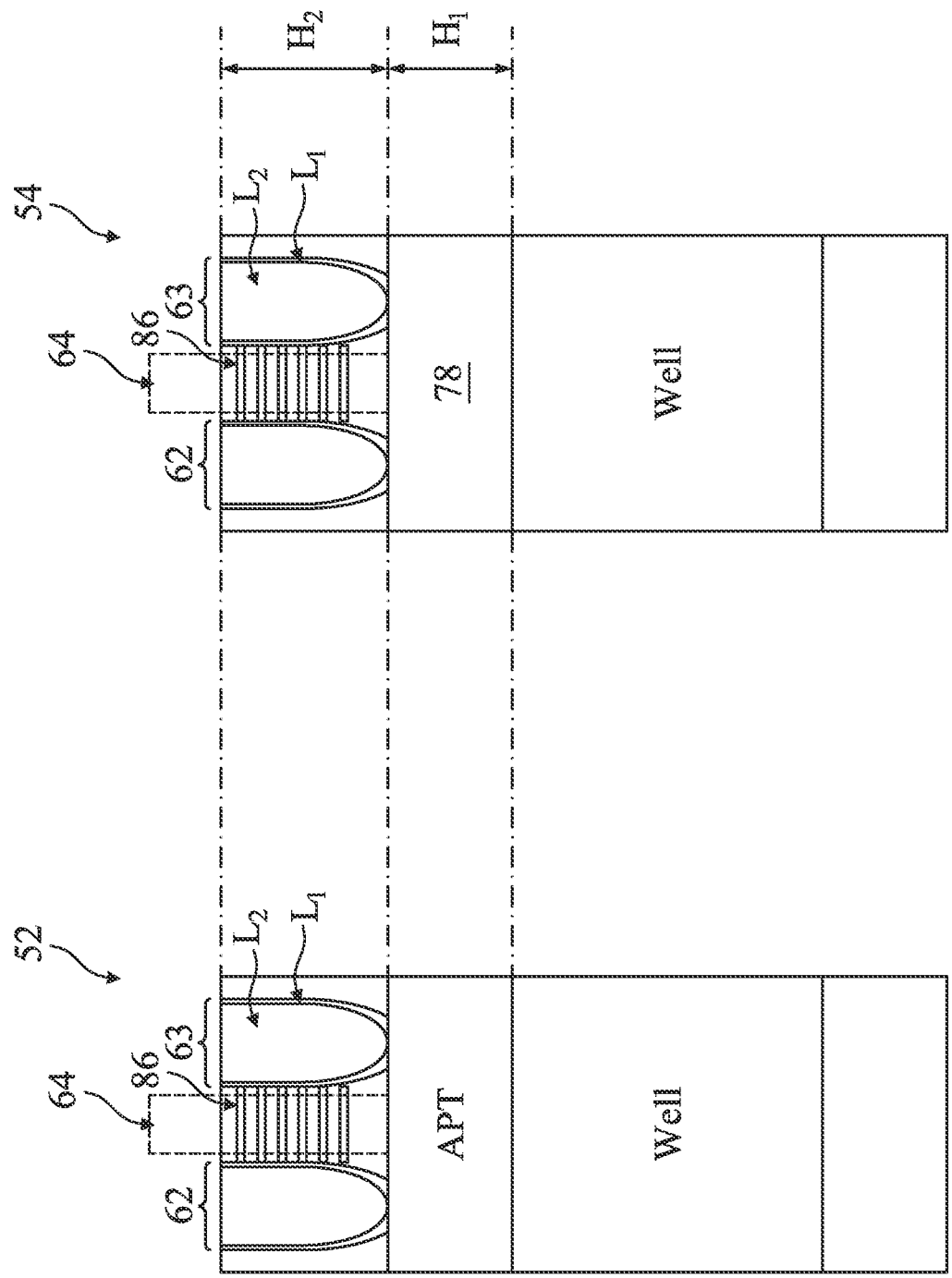
FIG. 10 is a sectional view of an IC structure having a de-cap device with various doping profiles in accordance with various embodiments.

Various doped features, especially the reversed APT doped feature 80, are further described with reference to FIG. 10. FIG. 10 is a sectional view of the IC structure 50, in portion, constructed in accordance with some embodiments. The IC structure 50 includes a circuit module 52 (e.g., or a logic circuit) and a de-cap device 54, each including a GAA-FET, which further includes a doped well ("Well") and doped source 62 and drain 63. Particularly, the GAA-FET of the circuit module 52 includes an APT doped feature ("APT) while the GAA-FET of the de-cap device 54 includes a reversed APT doped feature 80 below the source 62 and the drain 63.

In some embodiments, the GAA-FETs in the circuit module 52 is n-type and the GAA-FETs in the de-cap device 54 is p-type. In this case, doping types and doping concentrations are as follow. For the GAA-FETs in the circuit module 52, the source 62 and the drain 63 are doped with a n-type dopant (such as phosphorous); and the well is doped with a p-type dopant. Especially, the source 62 and the drain 63 include two epitaxially grown semiconductor layers $L_1$ and $L_2$ with different doping concentrations. The first semiconductor layer $L_1$ includes a n-type dopant (such as phosphorous) with a doping concentration ranging between $10^{20}/cm^3$ and $10^{21}/cm^3$; and the second semiconductor layer $L_2$ includes a n-type dopant (such as phosphorous) with a doping concentration ranging between $10^{21}/cm^3$ and $8\times10^{21}/cm^3$; and the APT doped feature includes a p-type dopant (such as boron) with a doping concentration ranging between $2\times10^{13}/cm^3$ and $10^{14}/cm^3$. For the GAA-FETs in the de-cap device 54, the source 62 and the drain 63 are doped with a p-type dopant (such as boron); and the well is doped with a n-type dopant. Especially, the source 62 and the drain 63 include two epitaxially grown semiconductor layers $L_1$ and $L_2$ with different doping concentrations. The first semiconductor layer $L_1$ includes a p-type dopant (such as boron) with a doping concentration ranging between $10^{20}/cm^3$ and $10^{21}/cm^3$; and the second semiconductor layer $L_2$ includes a p-type dopant (such as boron) with a doping concentration ranging between $10^{21}/cm^3$ and $8\times10^{21}/cm^3$; and the APT doped feature 80 includes a p-type dopant (such as boron) with a doping concentration ranging between $2\times10^{13}/cm^3$ and $10^{14}/cm^3$. The reversed APT doped feature 80 of a p-type GAA-FETs in the de-cap device 54 and the APT doped feature of a n-type GAA-FETs in the circuit module 52 have a same doping type and a same doping profile. Accordingly, both can be formed by a same ion implantation process using a same photomask as described in FIG. 8.

In some embodiments, the GAA-FETs in the circuit module 52 is p-type and the GAA-FETs in the de-cap device 54 is n-type. In this case, doping types and doping concentrations are as follow. For the GAA-FETs in the circuit module 52, the source 62 and the drain 63 are doped with a n-type dopant (such as phosphorous); and the well is doped with a p-type dopant. Especially, the source 62 and the drain 63 include two epitaxially grown semiconductor layers $L_1$ and $L_2$ with different doping concentrations. The first semiconductor layer $L_1$ includes a p-type dopant (such as boron) with a doping concentration ranging between $10^{20}/cm^3$ and $10^{21}/cm^3$; and the second semiconductor layer $L_2$ includes a p-type dopant (such as boron) with a doping concentration ranging between $10^{21}/cm^3$ and $8\times10^{21}/cm^3$; and the APT doped feature includes a n-type dopant (such as phosphorous) with a doping concentration ranging between $2\times10^{13}/cm^3$ and $10^{14}/cm^3$. For the GAA_FET in the de-cap device 54, the source 62 and the drain 63 are doped with a n-type dopant (such as phosphorous); and the well is doped with a p-type dopant. Especially, the source 62 and the drain 63 include two epitaxially grown semiconductor layers $L_1$ and $L_2$ with different doping concentrations. The first semiconductor layer $L_1$ includes a n-type dopant (such as phosphorous) with a doping concentration ranging between $10^{20}/cm^3$ and $10^{21}/cm^3$; and the second semiconductor layer $L_2$ includes a n-type dopant (such as phosphorous) with a doping concentration ranging between $10^{21}/cm^3$ and $8\times10^{21}/cm^3$; and the APT doped feature 80 includes a n-type dopant (such as phosphorous) with a doping concentration ranging between $2\times10^{13}/cm^3$ and $10^{14}/cm^3$. The reversed APT doped feature 80 of a n-type GAA-FET in the de-cap device 54 and the APT doped feature of a n-type GAA-FET in the circuit module 52 have a same doping type and a same doping profile. Accordingly, both can be formed by a same ion implantation process using a same photomask as described in FIG. 9. Alternatively, the reversed APT doped feature 80 includes carbon as dopant with a doping concentration ranging between $2\times10^{13}/cm^3$ and $10^{14}/cm^3$. In the present embodiment, the source 62 and the drain 63 include a height $H_1$ ranging between 50 nm and 55 nm; and the reversed APT doped feature 80 and the APT doped feature include a height H2 ranging between 20 nm and 35 nm.

The Method 100 includes an operation 104 to form isolation features (isolation structures), such as isolation features 84 in FIG. 5. The isolation features 84 may include silicon oxide, silicon nitride, silicon oxynitride, fluoride-doped silicate glass (FSG), a low-k dielectric material, and/or other suitable materials. The isolation features 84 may include shallow trench isolation (STI) features. In one embodiment, the isolation features 84 are formed by etching trenches in the substrate 60; filling the trenches with one or more dielectric material described above by a deposition process; and followed by a chemical mechanical planarization (CMP) process. Other isolation features such as field oxide, local oxidation of silicon (LOCOS), and/or other suitable structures may also be implemented as the isolation features 84. Alternatively, the isolation features 84 may include a multi-layer structure, for example, having one or more thermal oxide liner layers. The isolation features 84 may be deposited by any suitable method, such as chemical vapor deposition (CVD), flowable CVD (FCVD), spin-on-glass (SOG), high-density plasma CVD (HDPCVD), high aspect ratio process (HARP), other suitable methods, or combinations thereof.

In some embodiments, the method 100 may include an operation 106 to form the fin active regions 82. In the operation 106, the isolation features 84 may be subsequently recessed (e.g., by etch-back) such that a top surface 84A of the isolation features 84 is below a top surface 82A of the fin active region 82, defining a fin height $H_f$ of the fin active region 82 for optimized coupling between the gate electrode and the channel. In some embodiments, the fin height of the semiconductor fins 204 ranges between 50 nm and 70 nm.

The method 100 includes an operation 108 to form dummy gate stacks to be replaced by metal gate stacks 64 at later stage. The formation of the dummy gate stacks includes deposition (such as depositing poly-silicon by CVD) and patterning, which further includes a lithography process and etching. In the present embodiment, the operation 108 further includes forming gate spacer 68 on sidewalls of the dummy gate stacks. The gate spacer 68 includes one or more dielectric material, such as silicon oxide, silicon nitride, silicon oxynitride or a combination thereof. The formation of the gate spacer 68 includes deposition (such as CVD) and anisotropic etching (such as plasma etching).

The method 100 includes an operation 110 to form source 62 and drain 63 on the fin active region 82 within the source/drain regions. In the operation 110, the source/drain (S/D) regions may be recessed by etching. In some embodiments, a hard mask having openings that expose the S/D regions may be used as an etch mask. A suitable etching process, such as a dry etching process, a wet etching process, an RIE process, or a combination thereof may be used to recess the S/D regions. The etching process at operation 110 may implement a dry etching process using an etchant including a bromine-containing gas (e.g., HBr and/or $CHBR_3$), a fluorine-containing gas (e.g., $CF_4$, $SF_6$, $CH_2F_2$, $CHF_3$, and/or $C_2F_6$), other suitable gases, or combinations thereof. The extent of which the fin active regions 82 within the S/D regions is removed may be controlled by adjusting the duration of the etching process. In some embodiments associated with the de-cap device 54 of FIG. 6, the recessing depth extends to whole thickness of the alternative epitaxially grown semiconductor layers.

The operation 110 also includes epitaxially growing a semiconductor material to fill in the recesses, thereby forming source 62 and drain 63 (or collectively referred to as S/D features). The S/D feature may include multiple epitaxial semiconductor layers, such as with different semiconductor composition, with different doping concentrations, or a combination thereof. For example, the S/D features includes a first semiconductor material layer with a first doping concentration; and a second semiconductor material layer disposed on the first semiconductor layer and having a second first doping concentration greater than the first doping concentration. In the present embodiment, the dopant is in-situ introduced into the S/D features during the selective epitaxial growth. The operation 110 may include other processing steps. For example, for the de-cap device 54 of FIG. 6, the operation 110 may include laterally etching in the recesses to selectively remove portions of one type of the alternative semiconductor material layers; and depositing dielectric material and etching to form inner spaces near the channels before the selective epitaxial growth.

The method 100 also includes an operation 112 to form an inter-layer dielectric (ILD) layer 78 on the workpiece to provide isolation functions among various conductive features. The ILD layer 78 includes one or more dielectric material and may be formed by deposition and CMP. The ILD layer 78 includes one or more dielectric material, such as silicon oxide, tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), low-k dielectric material or other suitable dielectric material. In various embodiments, the ILD layer 78 is deposited by CVD, HDPCVD, sub-atmospheric CVD (SACVD), HARP, a flowable CVD (FCVD), and/or a spin-on process. In some embodiments, forming the ILD layer 78 further includes performing a CMP process to planarize such that the top surfaces of the dummy gate stacks are exposed. In some embodiments, a bottom contact etch-stop layer (BCESL) may be deposited under the ILD layer 78 with a different composition, such as silicon nitride, to achieve etch selectivity. The BCESL is conformally deposited on the source 62, the drain 63 and the dummy gate stacks.

The method 100 includes an operation 114 to remove the dummy gate stack, partially or completely by etch, resulting in a gate trench in the ILD layer 78. The operation 114 may additionally include patterning with photolithography process. For example, the dummy gate stack for an n-type FET is removed by an etching process with a hard mask to cover the region for a p-type FET; and the dummy gate stack for the p-type FET is removed by another etching process with another hard mask to cover the region for the n-type FET in order to fill them separately with different material, such as different metals with respective work functions to reduce the threshold voltages. Forming the gate trench may include one or more etching processes that are selective to the materials included in the dummy gate stacks (e.g., polysilicon included). The etching processes may include dry etching, wet etching, RIE, or other suitable etching methods, or combinations thereof.

In the de-cap device 54 associated with FIG. 6, the method 100 also includes an operation 116 to perform an etching process to selectively remove the second semiconductor films in the gate trench to form gaps between layers of the first semiconductor films, such that portions of the first semiconductor material suspend in space with gaps among the stacked first semiconductor materials, functioning as channels 86 to the corresponding GAA-FET devices. As discussed above, the first semiconductor films include Si and the second semiconductor films include SiGe. Accordingly, the etching process at operation 116 selectively removes portions of SiGe without removing or substantially remove Si. In some embodiments, the etching process is an isotropic etching process (e.g., a dry etching process or a wet etching process). In an example embodiment, the operation 116 selectively removes portions of the second semiconductor films by a wet etching process that utilizes HF and/or $NH_4OH$ as an etchant, which initially oxidizes portions of the second semiconductor films to form $SiGeO_x$ and subsequently removes the $SiGeO_x$ by etch. The operation 116 may be implemented at other proper fabrication stage to form the channels 86.

In some embodiments, the method 100 may include an operation to convert the channels 86 into a different semiconductor material, such as for strain effect. In one example, the first semiconductor films are converted from silicon into silicon germanium. This can be achieved by a suitable method, such as an ion implantation to introduce germanium into the channels 86. Alternatively, the operation 116 removes the second semiconductor films, leaving a portion on the first semiconductor films. An annealing process is applied subsequently to drive germanium from the remaining portion of the second semiconductor films into the first semiconductor films. In some embodiments, the channels 86 may have different shapes in section view, such as a round shape, an elliptical shape, or an olive shape for GAA-FETs with a nanochannel structure, as illustrated in FIG. 6.

The method 100 proceeds to an operation 118 to form a metal gate stack 64 in the gate trench. In some embodiments, the metal gate stack 64 includes a gate dielectric layer 65 having a high-k dielectric material with a dielectric constant greater than that of silicon dioxide (about 3.9); and a gate electrode 66 having a metal or metal alloy. The formation of the metal gate stack 64 includes depositing various gate materials (including gate dielectric material and gate electrode material) and CMP. During the operation 118, various material layers of the metal gate stack 64 are deposited in the gate trench formed between the layers of the first semiconductor material. The gate dielectric layer may further include an interfacial (IF) layer (such as silicon oxide) underlying the high-k dielectric material. Though not depicted, the metal electrode may include multiple metal or metal alloy layers, such as a work function metal layer formed over the high-k dielectric material layer, a bulk conductive layer formed over the work function metal layer, other suitable layers, or combinations thereof. The high-k dielectric material may include one or more high-k dielectric materials (or one or more layers of high-k dielectric materials), such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof. The work function metal layer may include any suitable material, such as titanium nitride (TiN), tantalum nitride (TaN), ruthenium (Ru), molybdenum (Mo), tungsten (W), platinum (Pt), titanium (Ti), aluminum (Al), tantalum carbide (TaC), tantalum carbide nitride (TaCN), tantalum silicon nitride (TaSiN), titanium silicon nitride (TiSiN), other suitable materials, or combinations thereof. In some embodiments, the work function metal layer includes multiple material layers of the same or different types (i.e., both n-type work function metal or both p-type work function metal) in order to achieve a desired threshold voltage. The bulk conductive layer may include aluminum (Al), copper (Cu), tungsten (W), cobalt (Co), ruthenium (Ru), other suitable conductive materials, or combinations thereof. The metal gate structure 64 may include other material layers, such as a barrier layer, a glue layer, and/or a capping layer. The various layers of the metal gate stack 64 may be formed by any suitable method, such as CVD, ALD, PVD, plating, chemical oxidation, thermal oxidation, other suitable methods, or combinations thereof. Thereafter, the method 100 may perform one or more polishing process (e.g., CMP) to remove any excess conductive materials and planarize the top surface of the IC structure 50.

The method 100 may include an operation 120 to form S/D contact features 70 landing on the source 62 and the drain 63 to be in electrical contact with the corresponding the source 62 and the drain 63. Each contact feature may include one or more conductive layers and may be formed by a procedure that includes patterning to form a contact hole in the ILD layer 78, and deposition to fill the contact hole with one or more conductive material. The patterning process includes photolithography process and etching. The deposition may use any suitable method such as ALD, CVD, PVD, plating, and/or other suitable processes. In some embodiments, each S/D contact feature 70 includes a seed metal layer and a fill metal layer. In various embodiments, the seed metal layer includes cobalt (Co), tungsten (W), ruthenium (Ru), nickel (Ni), other suitable metals, or combinations thereof. The fill metal layer may include copper (Cu), tungsten (W), aluminum (Al), cobalt (Co), other suitable materials, or combinations thereof.

Figure 7:
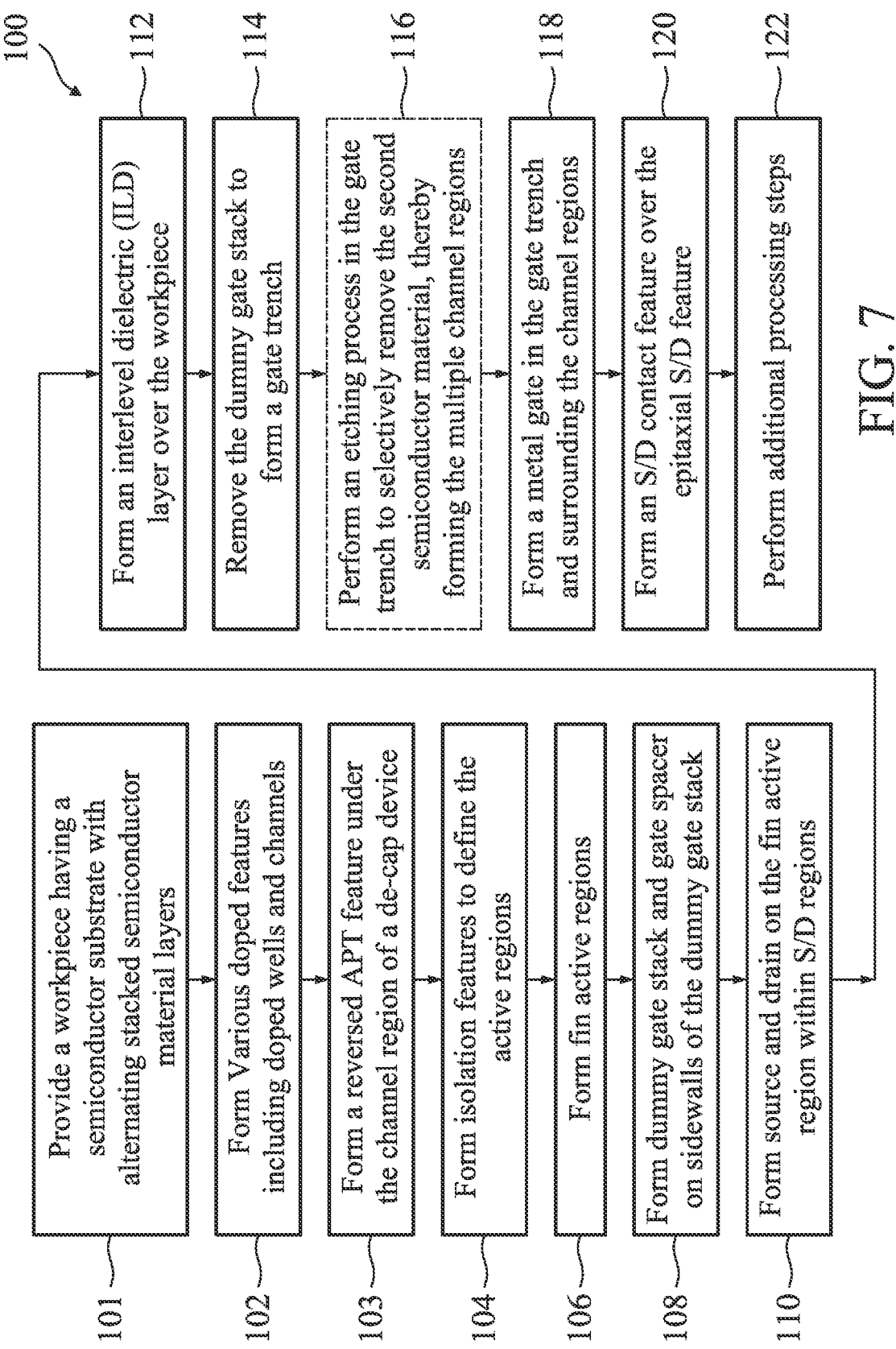
FIG. 7 is a flowchart of a method making an integrated circuit structure having a de-cap device in accordance with various embodiments.

Referring to FIG. 7, the method 100 at operation 122 may perform additional processing steps. For example, additional vertical interconnect features such as vias, horizontal interconnect features such as lines, and/or multilayer interconnect features such as metal layers and interlayer dielectrics can be formed over the semiconductor substrate 60. The various interconnect features may implement various conductive materials including copper (Cu), tungsten (W), cobalt (Co), aluminum (Al), titanium (Ti), tantalum (Ta), platinum (Pt), molybdenum (Mo), silver (Ag), gold (Au), manganese (Mn), zirconium (Zr), ruthenium (Ru), their respective alloys, metal silicides, other suitable materials, or combinations thereof. The metal silicides may include nickel silicide, cobalt silicide, tungsten silicide, tantalum silicide, titanium silicide, platinum silicide, erbium silicide, palladium silicide, other suitable metal silicides, or combinations thereof.

In summary, the present disclosure provides a method to form an IC structure 50 having a de-cap device 54 that includes a FET, a FinFET or a GAA-FET structure having the source and the drain connected from the top through the interconnection structure and from the bottom through the reversed APT doped feature, which increases capacitance of the de-cap device, reduces the occupying area of the de-cap device 54, and enhances the circuit performance of the IC structure.

Figure 11:
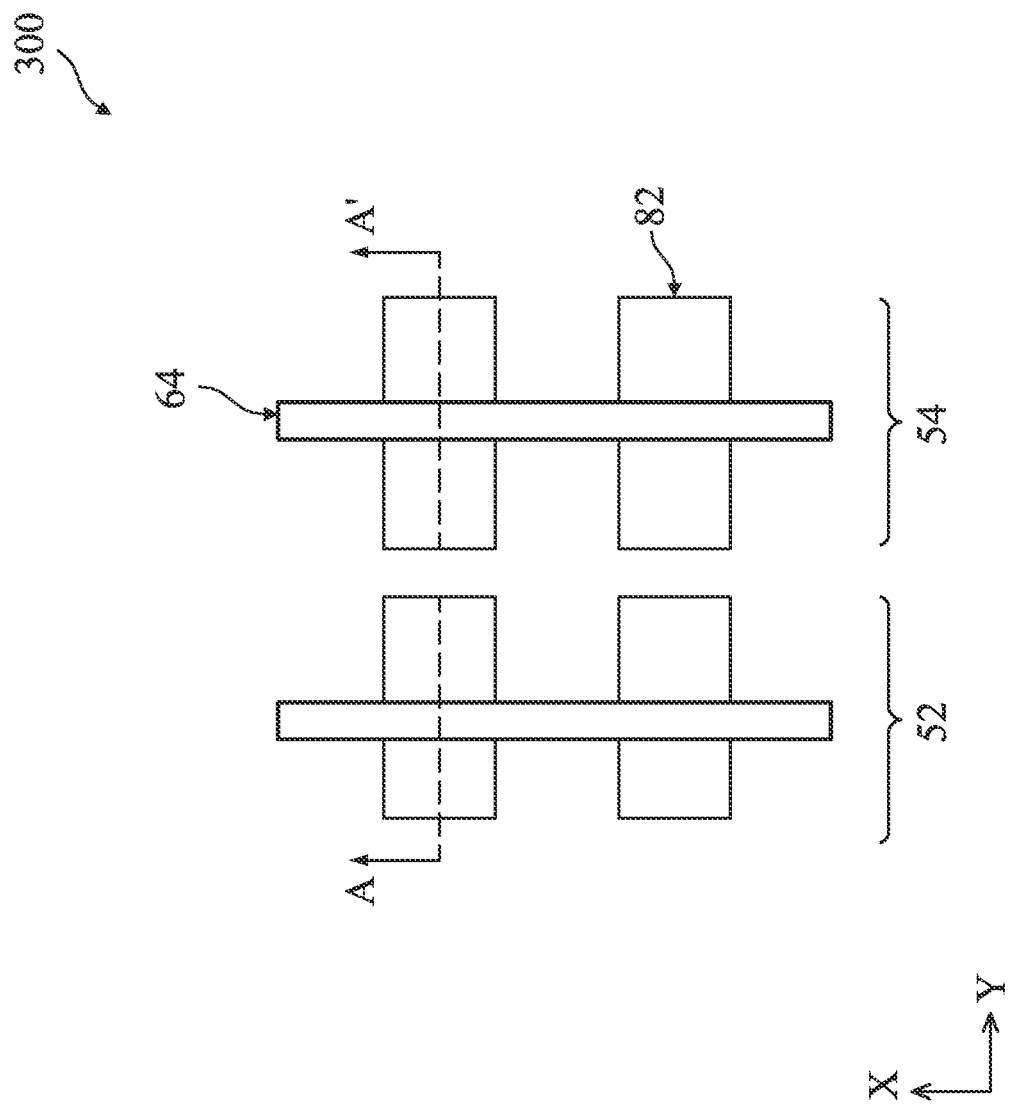
FIG. 11 is a top view of an IC structure having a de-cap device in accordance with various embodiments.
Figure 15:
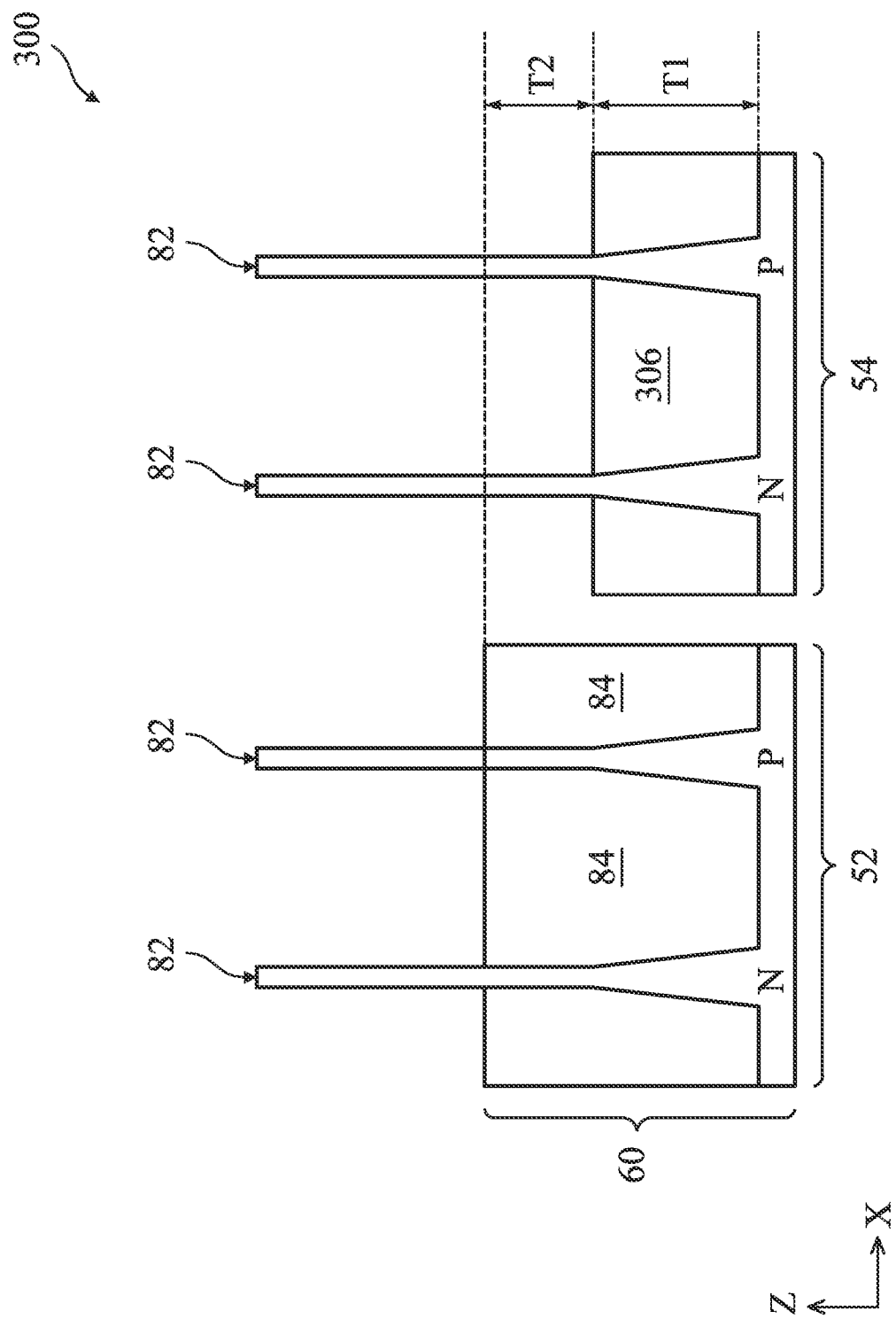
Figure 16:
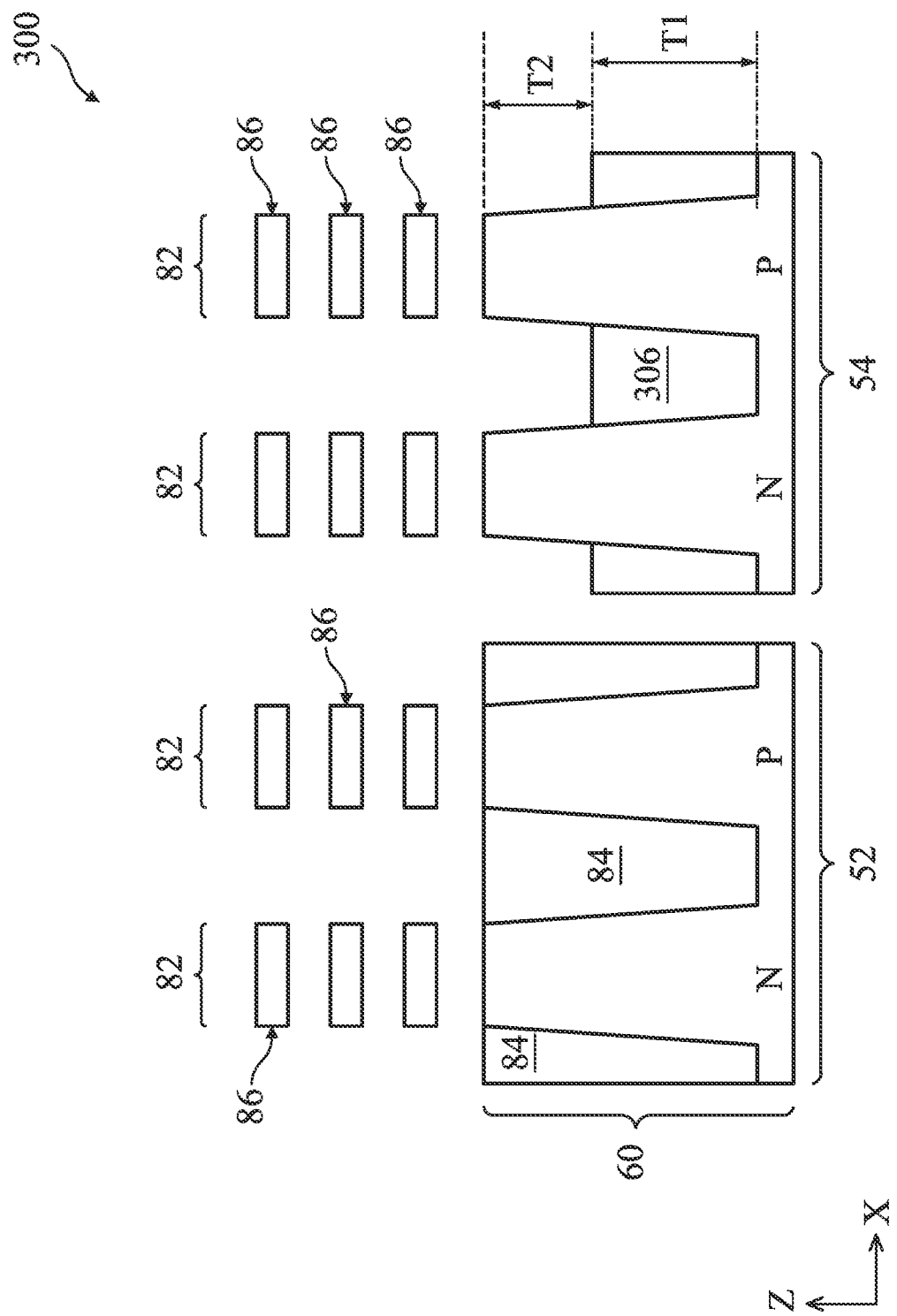
Figure 17:
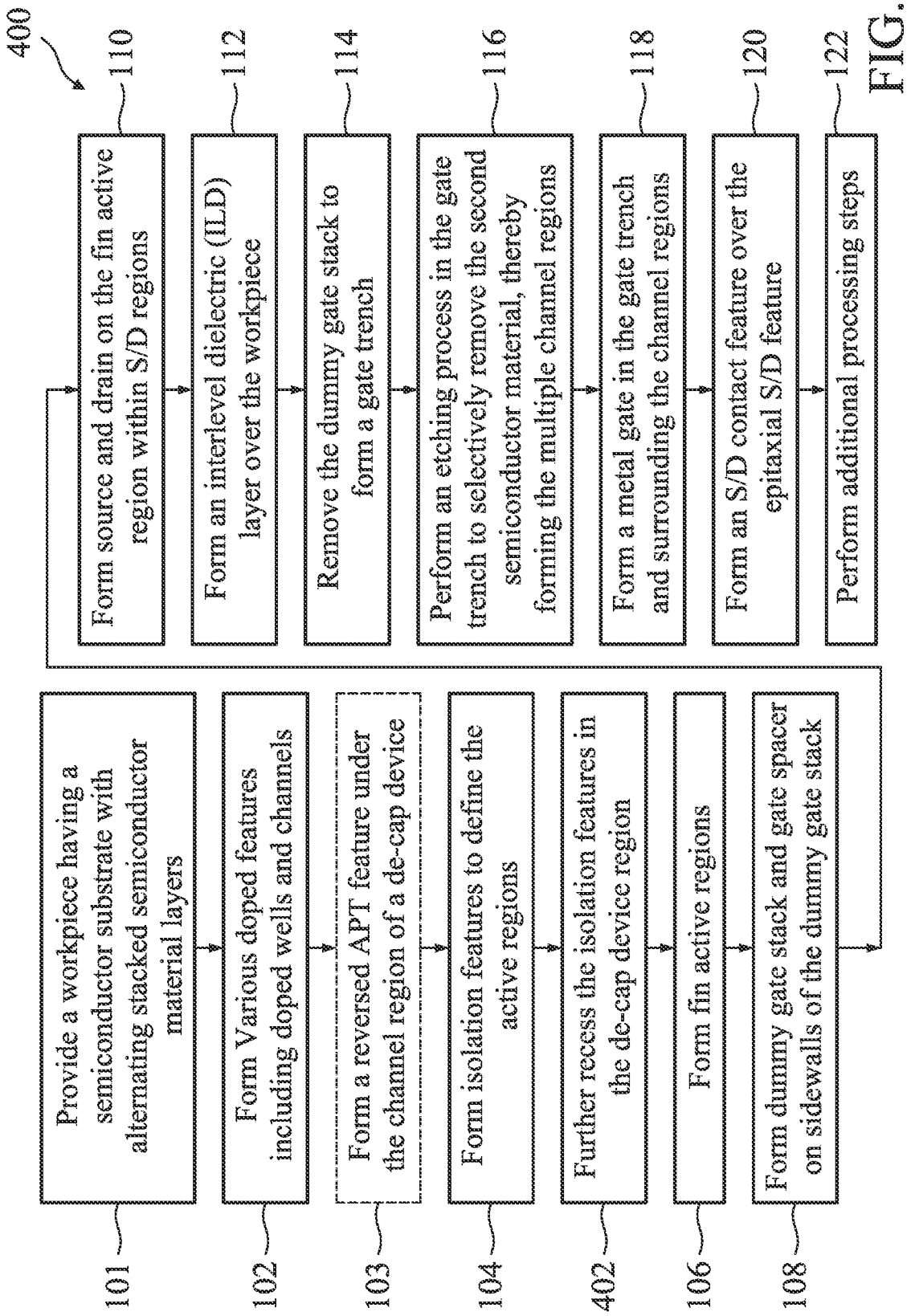
FIG. 17 is a flowchart of a method making an integrated circuit having a de-cap device structure of FIG. 15 or FIG. 16 in accordance with various embodiments.

FIG. 11 is a top view an IC structure 300, in portions, FIGS. 12-16 are sectional views of an IC structure 300, in portions, along the dashed line AA' at various fabrication stages, constructed in accordance with some embodiments. The IC structure 300 includes a circuit module 52 and a de-cap device 54 integrated in a semiconductor substrate. FIG. 17 is a flowchart of a method 400 making the IC structure 300. The method 400 and the IC structure 300 are collective described with reference to FIGS. 11-17. The IC structure 300 is similar to the IC structure 50. Particularly, the de-cap device 54 includes a FET (FinFET or GAA-FET) with the source 62 and the drain 63 connected through the contact features 70 and may additionally connected through a reversed APT doped feature 80. However, the isolation features 84 in the circuit module 52 and the de-cap device 54 are different in height. Similar components and processing steps making the same are not repeated below.

Figure 12:
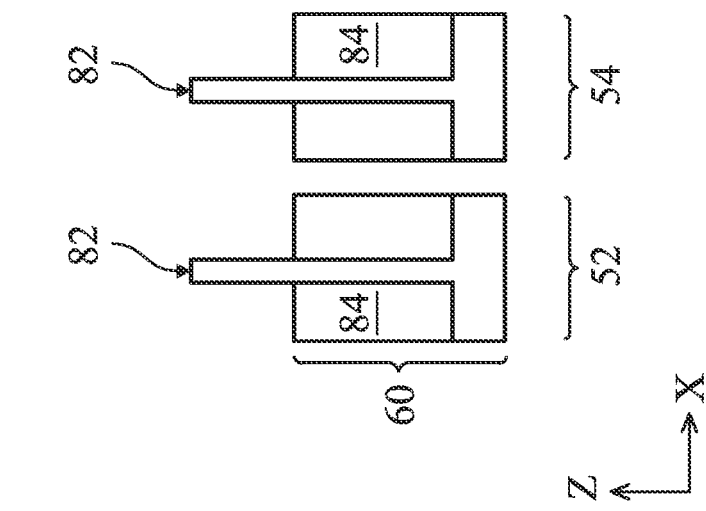
FIGS. 12, 13, 14, 15 and 16 are sectional views of the IC structure having a de-cap device of FIG. 11 at various fabrication stages in accordance with various embodiments.
Figure 13:
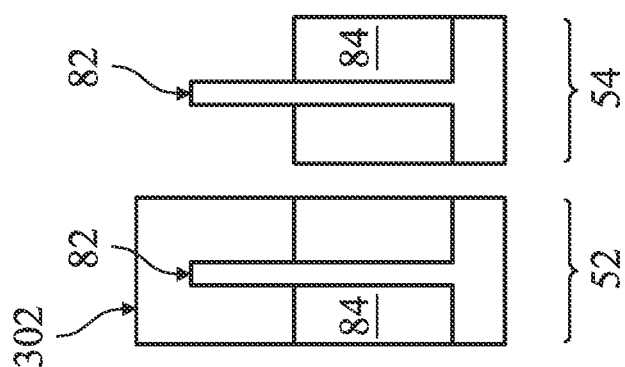

Especially, the operation 104 forms isolation features, such as STI features, by a procedure that includes patterning the ILD layer 78 to form a trench; depositing one or more dielectric material to fill the trench; performing a CMP process to remove the excessive dielectric material above the trench; and performing a first recessing process to recess the dielectric material, thereby forming the isolation features 84 and fin active regions 82, as illustrated in FIG. 12.

Figure 14:
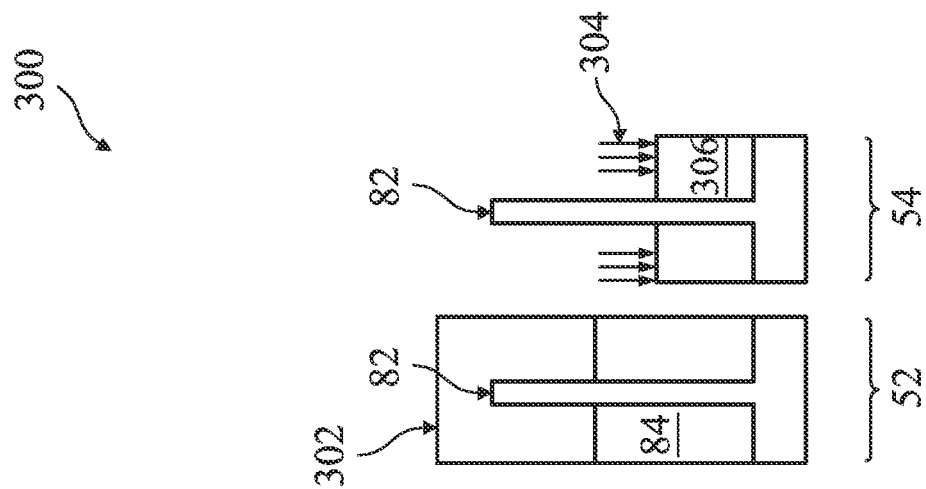

The method 400 further includes an operation 402 to perform a second recessing process to further recess the STI features 84 in the de-cap device region, thereby reducing the isolation features 84 in the de-cap device region to the isolation features 306 with less thickness, as illustrated in FIG. 14. In some embodiments, the operation 402 may include forming a patterned mask 302 with openings (in FIG. 13); and performing the second recessing process 304 through the openings of the patterned mask 302 (in FIG. 14). The patterned mask 302 may be a soft mask, such as a patterned resist layer formed by a lithography process, or a hard mask formed by etching to transfer the openings from the patterned resist layer to the hard mask. The patterned mask 302 covers the regions for the circuit module 52 and includes the openings to expose the regions for the de-cap device 54. The second recessing process 304 may include etching, such as dry etching, wet etching or a combination thereof.

Such formed IC structure 300 is further illustrated in FIG. 15. In the present embodiment, the circuit module 52 includes two exemplary fin active regions 82 (such as one for n-type FET and another for p-type FET); and the de-cap device 54 includes two exemplary fin active regions 82 as well (such as one for n-type FET and another for p-type FET). The isolation features 306 includes a thickness $T_1$ less than that of the isolation features 84 by $T_2$. In some examples, $T_1$ ranges between 30 nm and 40 nm and $T_2$ ranges between 20 nm and 30 nm.

The FET structure is illustrated only as one embodiment. The method 400 can also be used to form the IC structure 300 with the de-cap device 54 having a GAA-FET structure as illustrated in FIG. 16. In this case, the channels 86 are formed by a wire-release process in the operation 116. Since the isolation features 306 has a reduced thickness, the corresponding capacitance of the de-cap device 54 is increased accordingly, therefore increasing the capacitance without increasing the device area. In some embodiments, this reduced isolation features 306 are further combined with the reversed APT doped feature 80 to collectively increasing the capacitance of the de-cap device 54 without increasing the device area and the fabrication cost.

The present disclosure provides various embodiments of an IC structure having a circuit module and a de-cap device integrated together. The de-cap device includes a FET structure, such as a FinFET structure or a GAA-FET structure. The de-cap device includes a source and a drain electrically connected through S/D contact features and a reversed APT doped feature connecting to the source and drain. Especially, the reversed APT doped feature includes a dopant of a same type to the dopant of the source and drain. In some embodiment, the isolation features (such as STI features) surrounding the de-cap device is further recessed relative to the STI features in the region for the circuit module (such as a logic circuit, an analog circuit or a combination thereof) to increase the capacitance of the de-cap device without increasing the device area. In some embodiments, this reduced isolation features are further combined with the reversed APT doped feature to collectively increasing the capacitance of the de-cap device without increasing the device area and the fabrication cost.

In one aspect, the present disclosure provides an integrated circuit that includes a circuit formed on a semiconductor substrate; and a de-cap device formed on the semiconductor substrate and integrated with the circuit. The de-cap device includes a filed-effect transistor (FET) that further includes a source and a drain connected through contact features landing on the source and drain, respectively; a gate stack overlying a channel and interposed between the source and the drain; and a doped feature disposed underlying the channel and connecting to the source and the drain, wherein the doped feature is doped with a dopant of a same type of the source and the drain.

In another aspect, the present disclosure provides a method that includes forming a source and a drain on a semiconductor substrate, wherein the source and the drain are doped with a first-type conductivity; forming a channel doped of a second-type conductivity being opposite to the first-type conductivity; forming a doped feature of the first-type conductivity, wherein the doped feature is underlying the channel and connects the source and the drain; and forming a gate stack that includes forming a gate dielectric layer and a gate electrode, wherein the source, the drain, the channel and the gate stack are components of a de-cap device having the source and the drain connected through an interconnection structure.

In yet another aspect, the present disclosure provides an integrated circuit that includes a first fin active region and a second fin active region on a semiconductor substrate; a first sallow-trench isolation (STI) feature surrounding the first fin active region; a second sallow-trench isolation (STI) feature surrounding the second fin active region, the first STI feature includes a top surface above a top surface of the second STI feature and below a top surface of the first and second fin active regions; a circuit having a first field-effect transistor (FET) formed on the first fin active region; and a de-cap device formed on the second fin active region, wherein the de-cap device includes a second FET that further includes a source and a drain connected through contact features landing on the source and drain, respectively, and a gate stack interposed between the source and the drain.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit, comprising:
   a first fin active region and a second fin active region on a semiconductor substrate;
   a circuit having a first field-effect transistor (FET) formed on the first fin active region; and
   a de-cap device formed on the second fin active region, wherein the de-cap device includes a second FET that further includes
   multiple channels vertically stacked on the semiconductor substrate,
   a source and a drain, each of the source and the drain extending down to be connected to each of the multiple channels,
   a gate stack interposed between the source and the drain, and extended to be around each of the multiple channels, and
   a doped feature connecting to the source and drain, wherein
   the source and the drain are connected through contact features landing on the source and the drain, respectively,
   the doped feature is doped to have a first type conductivity, and
   the multiple channels are doped to have a second type of conductivity opposite to the first type conductivity.

2. The integrated circuit of claim 1, wherein the source and the drain are doped to have the first type conductivity.

3. The integrated circuit of claim 1, wherein the doped feature is underlying the multiple channels and is configured to contact the source and the drain from bottom.

4. The integrated circuit of claim 1, further comprising
a first shallow trench isolation (STI) feature formed on the semiconductor substrate and surrounding the first fin active region, a top surface of the first fin active region being protruded above a top surface of the first STI feature, wherein the first FET is formed on the first fin active region; and
a second STI feature formed on the semiconductor substrate and surrounding the second fin active region, a top surface of the second fin active region being protruded above a top surface of the second STI feature, wherein the source, the drain, the multiple channels and the gate stack of the second FET are formed on the second fin active region.

5. The integrated circuit of claim 4, wherein the top surface of the first STI feature is above the top surface of the second STI feature.

6. The integrated circuit of claim 4, wherein
the second FET is a n-type FET;
the source and the drain are n-type doped;
the doped feature is n-type doped; and
the multiple channels are p-type doped.

7. The integrated circuit of claim 6, wherein
the first FET is a p-type FET having an anti-punch-through (APT) feature that is n-type doped, wherein the APT feature has a first doping concentration less than $1 \times 10^{14}/cm^3$;
the second FET is a n-type FET;
each of the source and the drain of the second FET includes a second doping concentration greater than $3 \times 10^{20}/cm^3$; and
the doped feature includes a third doping concentration being equal to the first doping concentration.

8. The integrated circuit of claim 4, wherein
the second FET is a p-type FET;
the source and the drain are p-type doped;
the doped feature is p-type doped; and
the multiple channels are n-type doped.

9. The integrated circuit of claim 8, wherein
the first FET is a n-type FET having an anti-punch-through (APT) feature that is p-type doped, wherein the APT feature has a first doping concentration less than $1 \times 10^{14}/cm^3$;
the second FET is a p-type FET;
each of the source and the drain of the second FET includes a second doping concentration greater than $3 \times 10^{20}/cm^3$; and
the doped feature includes a third doping concentration being equal to the first doping concentration.

10. The integrated circuit of claim 1, wherein
the gate stack includes a gate dielectric layer and a gate electrode,
the gate dielectric layer is surrounding the each of the multiple channels, and
the gate electrode is surrounding the each of the multiple channels.

11. The integrated circuit of claim 10, wherein
the first FET is a second-type FET having an anti-punch-through (APT) feature with the first-type conductivity;
the second FET is a first-type FET with the doped feature of the first-type conductivity; and
the doped feature of the second FET and the APT feature of the first FET are simultaneously formed by a same ion implantation process.

12. A method, comprising:
forming a first fin active region and a second fin active region on a semiconductor substrate;
forming a circuit having a first field-effect transistor (FET) on the first fin active region; and
forming a de-cap device formed on the second fin active region, wherein the forming a de-cap device includes forming a second FET that further includes
multiple channels vertically stacked on the semiconductor substrate,
a source and a drain, each of the source and the drain extending down to be connected to each of the multiple channels,
a gate stack interposed between the source and the drain, and extended to be around each of the multiple channels, and
a doped feature connecting to the source and drain, wherein
the source and the drain are connected through contact features landing on the source and the drain, respectively,
the doped feature is doped to have a first-type conductivity, and
the multiple channels are doped to have a second-type conductivity opposite to the first-type conductivity.

13. The method of claim 12, wherein the source and the drain are doped to have the first-type conductivity.

14. The method of claim 12, wherein the doped feature is underlying the multiple channels and is configured to contact the source and the drain from bottom.

15. The method of claim 12, further comprising
forming a first shallow trench isolation (STI) feature on the semiconductor substrate and surrounding the first fin active region, a top surface of the first fin active region being above a top surface of the first STI feature, the first FET being formed on the first fin active region; and
forming a second STI feature on the semiconductor substrate and surrounding the second fin active region, a top surface of the second fin active region being above a top surface of the second STI feature, wherein the source, the drain, the multiple channels and the gate stack of the second FET are formed on the second fin active region.

16. The method of claim 15, wherein the top surface of the first STI feature is above the top surface of the second STI feature.

17. A method, comprising:
providing a semiconductor substrate having a first area and a second area;
forming a first fin active region within the first area and a second fin active region within the second area;
forming a first gate stack on the first fin active region and a second gate stack on the second fin active region;
forming a first source and a first drain on the first fin active region and interposed by the first gate stack, wherein the first source and the first drain are doped with a first-type conductivity;
forming a second source and a second drain on the second fin active region and interposed by the second gate stack, wherein the second source and the second drain are doped with a second-type conductivity that is opposite to the first-type conductivity;
forming a patterned mask having a first opening for an anti-punch-through (APT) feature to a first field-effect transistor (FET) and having the second-type conductivity and a second opening for a doped feature to a de-cap device and having the second-type conductivity; and performing an ion implantation process through the patterned mask using a dopant of the second-type conductivity, thereby forming the doped feature and the APT feature, wherein the APT feature contacts the second source and the second drain.

18. The method of claim 17, further comprising forming an interconnect structure on the semiconductor substrate, wherein the interconnect structure is designed to electrically connect the second source and the second drain;

the first source, the first drain, the first gate stack and the APT feature are configured to form the first FET; and the second source, the second drain, the second gate stack and the doped feature are configured to form the de-cap device.

19. The method of claim 17, further comprising forming first multiple channels each connecting the first source and the first drain, wherein the first multiple channels are vertically stacked and are doped to have the second-type conductivity; and forming second multiple channels each connecting the second source and the second drain, wherein the second multiple channels are vertically stacked and are doped to have the first-type conductivity.

20. The method of claim 19, wherein the second gate stack is formed to wrap around the second multiple channels.

* * * * *